(12) United States Patent
Ahn et al.

(10) Patent No.: US 6,790,791 B2
(45) Date of Patent: Sep. 14, 2004

(54) LANTHANIDE DOPED $TiO_x$ DIELECTRIC FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/219,878

(22) Filed: Aug. 15, 2002

(65) Prior Publication Data

US 2004/0033701 A1 Feb. 19, 2004

(51) Int. Cl.[7] .......................... H01L 21/31; H01L 21/469
(52) U.S. Cl. .................. 438/783; 438/778; 438/142; 438/381; 438/128
(58) Field of Search .................... 438/783, 784, 438/778, 142, 381, 128

(56) References Cited

U.S. PATENT DOCUMENTS

| | | | |
|---|---|---|---|
| 4,215,156 A | 7/1980 | Dalal et al. | 427/84 |
| 4,333,808 A | 6/1982 | Bhattacharyya et al. | 204/192 D |
| 4,394,673 A | 7/1983 | Thompson et al. | 357/15 |
| 4,399,424 A | 8/1983 | Rigby | 338/34 |
| 4,413,022 A | 11/1983 | Suntola et al. | 427/255.2 |
| 4,647,947 A | 3/1987 | Takeoka et al. | 345/135.1 |
| 4,920,071 A | 4/1990 | Thomas | 437/188 |
| 5,055,319 A | 10/1991 | Bunshah et al. | 427/38 |
| 5,595,606 A | 1/1997 | Fujikawa et al. | 118/725 |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,828,080 A | 10/1998 | Yano et al. | 257/43 |
| 5,840,897 A | 11/1998 | Kirlin et al. | 546/2 |
| 6,013,553 A | 1/2000 | Wallace et al. | 438/287 |
| 6,020,024 A | 2/2000 | Maiti et al. | 427/248.1 |
| 6,027,961 A | 2/2000 | Maiti et al. | 438/199 |
| 6,057,271 A | 5/2000 | Kenjiro et al. | 505/475 |
| 6,093,944 A | * 7/2000 | VanDover | 257/310 |
| 6,110,529 A | 8/2000 | Gardiner et al. | 427/250 |
| 6,171,900 B1 | 1/2001 | Sun | 438/240 |
| 6,203,613 B1 | 3/2001 | Gates et al. | 117/104 |
| 6,211,035 B1 | 4/2001 | Moise et al. | 438/396 |

(List continued on next page.)

FOREIGN PATENT DOCUMENTS

JP 2001-332546 11/2001 ......... H01L/21/316

OTHER PUBLICATIONS

Aarik, Jaan, et al., "Atomic layer growth of epitaxial TiO/sub 2/ thin films from TiCl/sub 4/ and H/sub 2/O on alpha –Al/sub 2/O/sub 3/ substrates", *Journal of Crystal Growth*, vol. 242, No. 1–2, (2002),189–198.

(List continued on next page.)

Primary Examiner—Richard Elms
Assistant Examiner—Beth E. Owens
(74) Attorney, Agent, or Firm—Schwegman, Lundberg, Woessner & Kluth, P.A.

(57) ABSTRACT

A dielectric film containing lanthanide doped $TiO_x$ and a method of fabricating such a dielectric film produce a reliable gate dielectric having an equivalent oxide thickness thinner than attainable using $SiO_2$. A dielectric film is formed by ion assisted electron beam evaporation of $TiO_2$ and electron beam evaporation of a lanthanide selected from a group consisting of Nd, Tb, and Dy. The growth rate is controlled to provide a dielectric film having a lanthanide content ranging from about ten to about thirty percent of the dielectric film. These dielectric films containing lanthanide doped $TiO_x$ are amorphous and thermodynamically stable such that the lanthanide doped $TiO_x$ will have minimal reactions with a silicon substrate or other structures during processing.

53 Claims, 7 Drawing Sheets

U.S. PATENT DOCUMENTS

| | | | |
|---|---|---|---|
| 6,225,168 B1 | 5/2001 | Gardner et al. | 438/287 |
| 6,225,237 B1 | 5/2001 | Vaartstra | 438/778 |
| 6,297,539 B1 | 10/2001 | Ma et al. | 257/410 |
| 6,303,481 B2 | 10/2001 | Park | 438/591 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,432,779 B1 | 8/2002 | Hobbs et al. | 438/287 |
| 6,445,023 B1 | 9/2002 | Vaartstra et al. | 257/295 |
| 6,458,701 B1 | 10/2002 | Chae et al. | 438/680 |
| 6,465,334 B1 | 10/2002 | Buynoski et al. | 438/591 |
| 6,495,436 B2 | 12/2002 | Ahn et al. | 438/591 |
| 6,521,911 B2 | 2/2003 | Parsons et al. | 257/52 |
| 6,534,420 B2 | 3/2003 | Ahn et al. | 438/768 |
| 6,602,338 B2 * | 8/2003 | Chen et al. | 106/287.19 |
| 6,608,378 B2 | 8/2003 | Forbes et al. | 257/701 |
| 2002/0086555 A1 | 7/2002 | Ahn et al. | 438/783 |
| 2002/0089023 A1 | 7/2002 | Yu et al. | 257/411 |
| 2002/0111001 A1 | 8/2002 | Ahn et al. | 438/592 |
| 2002/0155688 A1 | 10/2002 | Ahn et al. | 438/592 |
| 2002/0155689 A1 | 10/2002 | Ahn et al. | 29/76 |
| 2002/0192974 A1 | 12/2002 | Ahn et al. | 438/722 |
| 2003/0003702 A1 | 1/2003 | Ahn et al. | 438/591 |
| 2003/0017717 A1 | 1/2003 | Ahn et al. | 438/768 |
| 2003/0175411 A1 | 9/2003 | Kodas et al. | 427/58 |
| 2003/0028747 A1 | 12/2003 | Ahn et al. | 438/591 |
| 2004/0033681 A1 | 2/2004 | Ahn et al. | 438/591 |

OTHER PUBLICATIONS

Bunshah, Rointan F., et al., "Deposition Technologies for Films and Coatings: Developments and Applications", Noyes Publications, 102–103.

Iddles, D M., et al., "Relationships between dopants, microstructure and the microwave dielectric properties of ZrO2–TiO2–SnO2 ceramics", *Journal of Materials Science*, vol. 27, (1992),6303–6310.

Jeon, Sanghun , et al., "Excellent Electrical Characteristics of Lanthanide (Pr, Nd, Sm, Gd, and Dy) Oxide and Lanthanide–doped Oxide for MOS Gate Dielectric Applications", *Technical Digest of IEDM*, (2001),471–474.

Kawai, Y , et al., "Ultra–low–temperature growth of high–integrity gate oxide films by low–energy Ion–assisted oxidation", *Applied Physics Letters*, (Apr. 1994),pp. 2223–2225.

Martin, P J., et al., "Ion–beam–assisted deposition of thin films", *Applied Optics*, (Jan. 1983),pp. 178–184.

Park, J J., et al., *J. of the Electrochemical Soc., 149*, (2002),G89–G94.

Tarre, A , et al., "Comparative study of low–temperature chloride atomic–layer chemical vapor deposition of TiO2 and SnO2", *Applied Surface Science*, (2001),111–116.

Aarik, Jaan., et al., "Texture development in nanocrystalline hafnium dioxide thin films grown by atomic layer deposition", *Journal of Crystal Growth*, (2000), pp. 105–113.

Cheng, Baohong., et al. , "The Impact of High–k Gate Dielectrics and Metal Gate Electrodes on Sub–100nm MOSFET's", *IEEE Transactions on Electron Devices*, (1999), 1537–1544.

Desu, S.B., "Minimization of Fatigue in Ferroelectric Films", *Phys. Stat. Sol. (a) 151*, (1995), pp. 467–480.

Engelhardt, M., "Modern Applications of Plasma Etching and Patterning in Silicon Process Technology", *Contrib. Plasma. Phys., 39(5)*, (1999), pp. 473–478.

Fuyuki, Takashi, "Electronic Properties of the Interface between Si and TiO2 Deposited at Very Low Temperatures", *Journal of Applied Physics*, (1986), pp. 1288–1291.

Gartner, M., "Spectroellipsometric characterization of lanthanide–doped TiO2 films obtained via the sol–gel technique", *Thin Solid Films*, (1993), pp. 561–565.

Geller, S., et al. , "Crystallographic Studies of Perovskite–like Compounds. II. Rare Earth Aluminates", *Acta Cryst. vol. 9*, (May 29, 1956), pp. 1019–1025.

Giess, E..A. , et al. , "Lanthanide gallate perovskite–type substrates for epitaxial, high–Tc superconducting Ba2YCu3O7– films", *IBM J. Res. Develop. vol. 34, No. 6*, (Nov. 6, 1990), pp. 916–926.

Hirayama, Masaki., et al. , "Low–Temperature Growth of High–Integrity Silicon Oxide Films by Oxygen Radical Generated in High Density Krypton Plasma", *IEDM Technical Digest*, (1999), pp. 249–252.

Hubbard, K.. J. , et al. , "Thermodynamic stability of binary oxides in contact with silicon", *J. Mater. Res.*, (Nov. 1996), pp. 2757–2776.

Hunt, C..E. , et al. , "Direct bonding of micromachined silicon wafers for laser diode heat exchanger applications", *J. Micromech. Microeng., 1*, (1991), pp. 152–156.

Jeong, Chang–Wook., et al. , "Plasma–Assisted Atomic Layer Growth of High–Quality Aluminum Oxide Thin Films", *Japanese Journal of Applied Physics*, (Jan. 2001), pp. 285–289.

Keomany, D., "Sol gel preparation of mixedcerium–titanium oxide thin films", *Solar Energy Materials and Solar Cells*, (1994), pp. 429–441.

Kim, C.T. , et al. , "Application of Al2O3 Grown by Atomic Layer Deposition to DRAM and FeRAM", *International Symposium in Integrated Ferroelectrics*, (Mar. 2000), pp. 316.

Kim, D., et al. , "Atomic Control of Substrate Termination and Heteroepitaxial Growth of SrTiO3/LaAlO3 Films", *Journal of the Korean Physical Society vol. 36 No. 6*, (Jun. 2000), pp. 444–448.

Kim, Y., et al. , "Substrate dependence on the optical properties of Al2O3 films grown by atomic layer deposition", *Applied Physics Letters*, (Dec. 1997), pp. 3604–3606.

Krauter, G., et al. , "Room Temperature Silicon Wafer Bonding with Ultra–Thin Polymer Films", *Advanced Materials, 9(5)*, pp. 417–420.

Kukli, Kaupo., et al. , "Atomic Layer Deposition of Titanium Oxide from TiI4 and H2O2", *Chemical Vapor Deposition*, (2000), pp. 303–310.

Kukli, K., et al. , "Controlled Growth of Yttrium Oxysulphide Thin Films by Atomic Layer Deposition", *Materials Science Forum*, (1999), pp. 216–221.

Lee, A..E. , et al. , "Epitaxially grown sputtered LaAlO3 films", *Appl. Phys. Lett. 57(19)*, (Nov. 5, 1990), pp. 2019–2021.

Lee, Cheng–Chung., "Ion–assisted deposition of silver thin films", *Thin Solid Films*, (2000), pp. 95–97.

Lee, Dong.H. , "Metalorganic chemical vapor deposition of Tio2:n anatase thin film on Si substrate", *Applied Physics Letters*, (Feb. 1995), pp. 815–816.

Lee, L..P. , et al. , "Monolithic 77 K dc SQUID magnetometer", *Appl. Phys. Lett. 59(23)*, (Dec. 2, 1991), pp. 3051–3053.

Leskela, M., et al. , "ALD precursor chemistry: Evolution and future challenges", *Journal de Physique*, (1999), pp. 837–852.

Liu, C.T. , "Circuit Requirement and Integration Challenges of Thin Gate Dielectrics for Ultra Small MOSFET's", *IEDM*, (1998), pp. 747–750.

Lucovsky, G., et al. , "Microscopic model for enhanced dielectric constants in low concentration SiO2–rich noncrystalline Zr and Hf silicate alloys", *Applied Physics Letters*, (Oct. 2000), pp. 2912–2914.

Molodyk, A..A. , et al. , "Volatile Surfactant–Assisted MOCVD: Application to LaAl03 Thin Film Growth", *Chem. Vap. Deposition vol. 6, No. 3*, (2000,), pp. 133–138.

Molsa, Heini., et al. , "Growth of Yttrium Oxide Thin Films from B–Diketonate Precursor", *Advanced Materials for Optics and Electronics*, (1994), pp. 389–400.

Muller, D.A. , "The electronic structure at the atomic scale of ultrathin gate oxides", *Nature, vol. 399, No. 6738*, Jun. 24, 1999, (1999), pp. 758–761.

Nakajima, Anri., et al. , "NH3–annealed atomic–layer–deposited silicon nitride as a high–k gate dielectric with high reliability", *Applied Physics Letters*, (Feb. 2002), pp. 1252–1254.

Neumayer, D.A. , et al. , "Materials characterization of ZrO2–SiO2 and HfO2–SiO2 binary oxides deposited by chemical solution deposition", *Journal of Applied Physics*, (Aug. 2001), pp. 1801–1808.

Nieminen, Minna., et al. , "Formation and stability of lanthanum oxide thin films deposited from B–diketonate precursor", *Applied Surface Science*, (2001), pp. 155–165.

Ohring, Milton., "The Materials Science of Thin Films", *Academic Press Inc.*, (1992), pp. 118, 121, 125.

Osten, H.J. , et al. , "High–k Gate Dielectrics with Ultra–low Leakage Current Based on Praseodymium Oxide", *IEEE*, (2000), pp. 653–656.

Park, Byung–Eun., et al. , "Electrical properties of LaAlO3/Si and SrO.8Bi2.2Ta2O9/LaAlO3/Si structures", *Applied Physics Letters*, vol. 79, No. 6,(Aug. 6, 2001), pp. 806–808.

Qi, Wen–Jie., et al. , "MOSCAP and MOSFET characteristics using ZrO2 gate dielectric deposited directly on Si", *IEDM Technical Digest*, (1999), pp. 145–148.

Rayner Jr., G., et al. , "The Structure of Plasma–Deposited and Annealed Pseudo–Binary ZrO2–SiO2 Alloys", *Material Res. Soc. Symp.*, (2000), pp. C1.3.1–C1.3.9.

Ritala, Mikko., "Atomic Layer Epitaxy Growth of Titanium, Zirconium and Hafnium Dioxide Thin Films", *Annales Academiae Scientiarum Fennicae*, (1994), pp. 24–25.

Rotondaro, A.L. , et al. , "Advanced CMOS Transistors with a Novel HfSiON Gate Dielectric", *Symposium on VLSI Technology Digest of Technical Papers*, (2002), pp. 148–149.

Saito, Yuji., et al. , "Advantage of Radical Oxidation for Improving Reliability of Ultra–Thin Gate Oxide", *2000 Symposium on VLSI Technology Digest of Technical Papers*, (2000), pp. 176–177.

Saito, Yuji., et al. , "High–Integrity Silicon Oxide Grown at Low–Temperture by Atomic Oxygen Generated in High–Density Krypton Plasma", *Extended Abstracts of the 1999 International Conference on Solid State Devices and Materials*, (1999), pp. 152–153.

Shanware, A., et al. , "Reliability evaluation of HfSiON gate dielectric film with 12.8 A SiO2 equivalent thickness", *International Electron Devices Meeting*, (2001), pp. 137–140.

Shin, Chang.H. , et al. , "Fabriation and Characterization of MFISFET using Al2O3 Insulating Layer for Non–Volatile Memory", *12th International Symposium in Integrated Ferroelectrics*, (Mar. 2000), pp. 1–9.

Sneh, Ofer., et al. , "Thin film atomic layer deposition equipment for semiconductor processing", *Thin Solid Films*, (2002), pp. 248–261.

Song, Hyun–Jung., et al. , "Atomic Layer Deposition of Ta2O5 Films Using Ta(OC2H5)5 and NH3", *Mat. Res. Soc. Symp. Proc.*, (1999), pp. 469–471.

Suntola, T., "Atomic Layer Epitaxy", *Handbook of Crystal Growth, 3; Thin Films of Epitaxy, Pat B: Growth Mechanics and Dynamics*, Amsterdam,(1994), pp. 601–663.

Suntola, T., "Atomic layer epitaxy", *Thin Solid Films, 216*, (1992), pp. 84–89.

Takemoto, J.H. , et al. , "Microstrip Resonators and Filters Using High–TC Superconducting Thin Films on LaAlO3", *IEEE Transaction on Magnetics, vol. 27, No. 2*, (Mar., 1991), pp. 2549–2552.

Van Dover, R.B. , "Amorphous lanthanide–doped TiOx dielectric films", *Applied Physics Letters*, (May 1999), pp. 3041–3043.

Viirola, H., et al. , "Controlled growth of antimony–doped tin dioxide thin films by atomic layer epitaxy", *Thin Solid Films*, (1994), pp. 127–135.

Viirola, H., et al. , "Controlled growth of tin oxide thin films by atomic layer epitaxy", *Thin Solid Films*, (1994), pp. 144–149.

Visokay, M.R. , et al. , "Application of HfSiON as a gate dielectric material", *Applied Physics Letters*, (Apr. 2002), pp. 3183–3185.

Wilk, G.D. , et al. , "Hafnium and zirconium silicates for advanced gate dielectrics", *Journal of Applied Physics*, (Jan. 2000), pp. 484–492.

Wilk, G.D. , et al. "High–K gate dielectrics: Current status and materials properties considerations", *J. Appl. Phys., vol. 89, No. 10*, (May 15, 2001), pp. 5243–5275.

Zucker, O., et al. , "Application of Oxygen Plasma Processing to Silicon Direct Bonding", *Sensors and Actuators A, 36*, (1993), pp. 227–231.

Guo, et al., "High Quality Ultra–thin (1.5nm) TiO2/Si3N4 Gate Dielectric for Deep Sub–micron CMOS Technology," Cited in related application,(1999).

Kwo, J., et al., "High gate dielectric Gd2O3 and Y2O3 for silicon, " *Applied Physics Letters*, 77(1), (Jul. 3, 2000), 130–132.

Kwo, J., "Properties of high k gate dielectrics Gd2O3 and Y2O3 for Si," *Journal of Applied Physics*, 89(7), (2001), 3920–3927.

Niilisk, A., "Atomic–scale optical monitoring of the initial growth of TiO2 thin films," *Proceedings of the SPIE –The International Society for Optical Engineering*, 4318, (2001), 72–77.

\* cited by examiner

LANTHANIDE DOPED TIO$_x$ DIELECTRIC FILMS

RELATED APPLICATIONS

This application is related to the following, co-pending, commonly assigned applications, incorporated herein by reference:

U.S. application Ser. No. 09/779,959, filed Feb. 9, 2001, entitled "Formation of Metal Oxide Gate Dielectric,"

U.S. application Ser. No. 09/908,767, filed Jul. 18, 2001, entitled "Methods for Forming Dielectric Materials and Methods for Forming Semiconductor Devices," and U.S. application Ser. No. 10/219,870, filed Aug. 15, 2002, entitled "Lanthanide Doped TiO$_x$ Dielectric Films By Plasma Oxidation."

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a source region 120 and a drain region 130. A body region 132 is located between source region 120 and drain region 130, the body region 132 defining a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon) or other conducting materials such as metal may be used.

In fabricating transistors to be smaller in size and reliably operating on lower power supplies, one important design criteria is the gate dielectric 140. The mainstay for forming the gate dielectric has been silicon dioxide, SiO$_2$. Thermally grown amorphous SiO$_2$ provides an electrically and thermodynamically stable material, where the interface of a SiO$_2$ layer with an underlying Si provides a high quality interface as well as superior electrical isolation properties. In typical processing, use of SiO$_2$ on Si has provided defect charge densities on the order of $10^{10}$/cm$^2$, midgap interface state densities of approximately $10^{10}$/cm$^2$ eV, and breakdown voltages in the range of 15 MV/cm. With such qualities, there would be no apparent need to use a material other than SiO$_2$, but with increased scaling, other requirements for gate dielectrics create the need to find other dielectric materials to be used for a gate dielectric.

What is needed is an alternate dielectric material for forming a gate dielectric that has a high dielectric constant relative to SiO$_2$, and is thermodynamically stable with respect to silicon such that forming the dielectric on a silicon layer will not result in SiO$_2$ formation, or diffusion of material, such as dopants, into the gate dielectric from the underlying silicon layer.

SUMMARY OF THE INVENTION

A solution to the problems as discussed above is addressed in embodiments of the present invention. In accordance with an embodiment of the present invention, a method of forming a dielectric film includes evaporating TiO$_2$ at a first rate, evaporating a lanthanide at a second rate, and controlling the first rate and the second rate to grow a dielectric film on a substrate, where the dielectric film contains TiO$_x$ doped with the lanthanide. In one embodiment, the lanthanide includes evaporating a lanthanide selected from a group consisting of Nd, Tb, Dy.

In one embodiment, lanthanide doped TiO$_x$ layers are formed by electron beam evaporation. In another embodiment, the evaporation of TiO$_2$ is assisted by ion beam bombardment of a substrate surface during deposition.

A gate dielectric formed as a dielectric film containing lanthanide doped TiO$_x$ has a larger dielectric constant than silicon dioxide, a relatively small leakage current, and good stability with respect to a silicon based substrate. Embodiments according to the teachings of the present invention include forming transistors, capacitors, memory devices, and electronic systems having dielectric layers containing lanthanide doped TiO$_x$. Other embodiments include structures for transistors, capacitors, memory devices, and electronic systems with gate dielectrics containing lanthanide doped TiO$_x$. Such gate dielectrics provide a significantly thinner equivalent oxide thickness compared with a silicon oxide gate having the same physical thickness. Alternatively, such gate dielectrics provide a significantly thicker physical thickness than a silicon oxide gate dielectric having the same equivalent oxide thickness.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
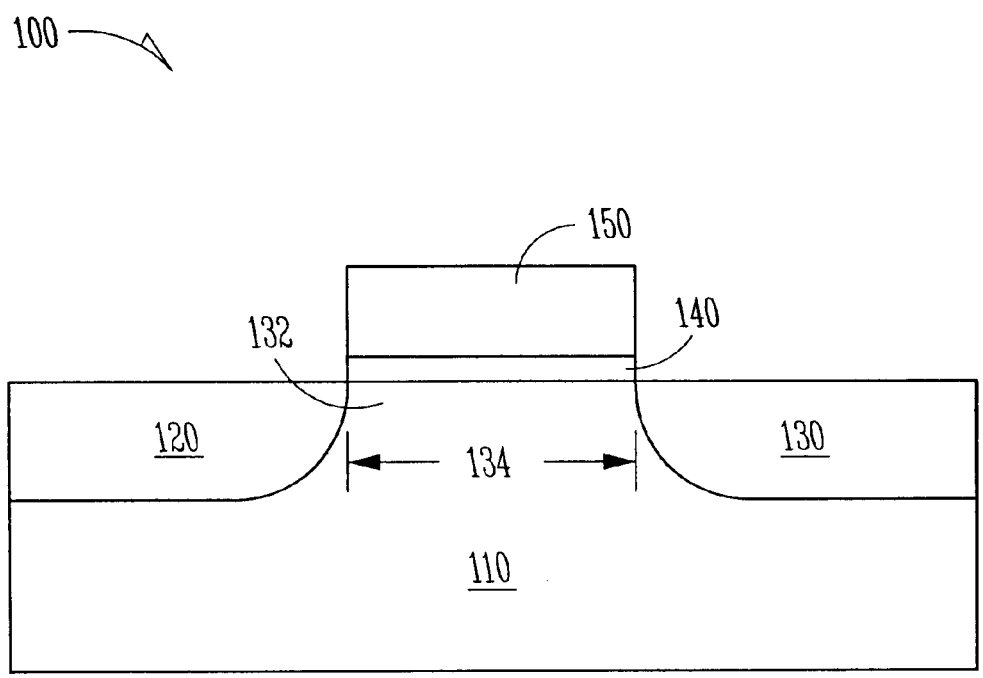
FIG. 1 shows a common configuration of a transistor in which an embodiment of a gate dielectric can be formed, according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in complementary metal-oxide-semiconductor field effect transistor (CMOS) technology.

Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7–8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of $SiO_2$, $\kappa_{ox}=3.9$, associated with $t_{eq}$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO_2} + (\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

In a recent article by G. D. Wilk et al., *Journal of Applied Physics*, vol. 89: no. 10, pp. 5243–5275 (2001), material properties of high dielectric materials for gate dielectrics were discussed. In this article, a number of oxides were identified as possible candidates to replace $SiO_2$ as a gate dielectric. The list of possible candidates included

| Material | Dielectric Constant ($\kappa$) | Band gap $E_g$ (eV) | Crystal Structure(s) |
|---|---|---|---|
| $SiO_2$ | 3.9 | 8.9 | Amorphous |
| $Si_3N_4$ | 7 | 5.1 | Amorphous |
| $Al_2O_3$ | 9 | 8.7 | Amorphous |
| $Y_2O_3$ | 15 | 5.6 | Cubic |
| $La_2O_3$ | 30 | 4.3 | Hexagonal, Cubic |
| $Ta_2O_3$ | 26 | 4.5 | Orthorhombic |
| $TiO_2$ | 80 | 3.5 | Tetrag. (rutile, anatase) |
| $HfO_2$ | 25 | 5.7 | Mono., Tetrag., Cubic |
| $ZrO_2$ | 25 | 7.8 | Mono., Tetrag., Cubic |

One of the advantages using $SiO_2$ as a gate dielectric has been that the formation of the $SiO_2$ layer results is an amorphous gate dielectric. Having an amorphous structure for a gate dielectric avoids high leakage paths associated with grain boundaries in polycrystalline gate dielectrics. Additionally, grain size and orientation changes throughout a polycrystalline gate dielectric can cause variations in the film's dielectric constant. From above, the materials having the advantage of a high dielectric constants relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Based solely on the size of the dielectric constant, titanium oxide, $TiO_2$, appears to be an excellent candidate for replacing $SiO_2$. However, $TiO_2$ does not provide the electrical properties generally desired for integrated circuits, such as, high electric field breakdown and low leakage current. Dielectric films substituting various cations into amorphous $TiO_x$ films by magnetron sputtering were found to provide improved electric field breakdown and leakage current with respect to undoped $TiO_2$ films. See, R. B. Dover, *Applied Physics Letters*, vol. 74: no. 20, pp. 3041–3043 (2001).

However, another consideration for selecting the material and method for forming a dielectric film for use in electronic devices and systems concerns the roughness of a dielectric film on a substrate. Surface roughness of a dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

An embodiment of the teachings of the present invention includes dielectric films containing $TiO_x$ doped with a lanthanide formed by ion assisted electron beam evaporation. Dielectric films formed on a substrate in such a manner will have a surface that is smoother than a film formed in another fashion such as sputtering. This increased smoothness, or decreased roughness, is due in part to the use of high purity target materials for evaporation. Further, with ion bombardment during deposition by electron beam evaporation, additional energy is provided for activation at the deposition interface to provide for increased packing density of the dielectric film. As a result of the ion bombardment during deposition, the dielectric film is not only smoother, but is more durable in a humid environment.

Figure 2:
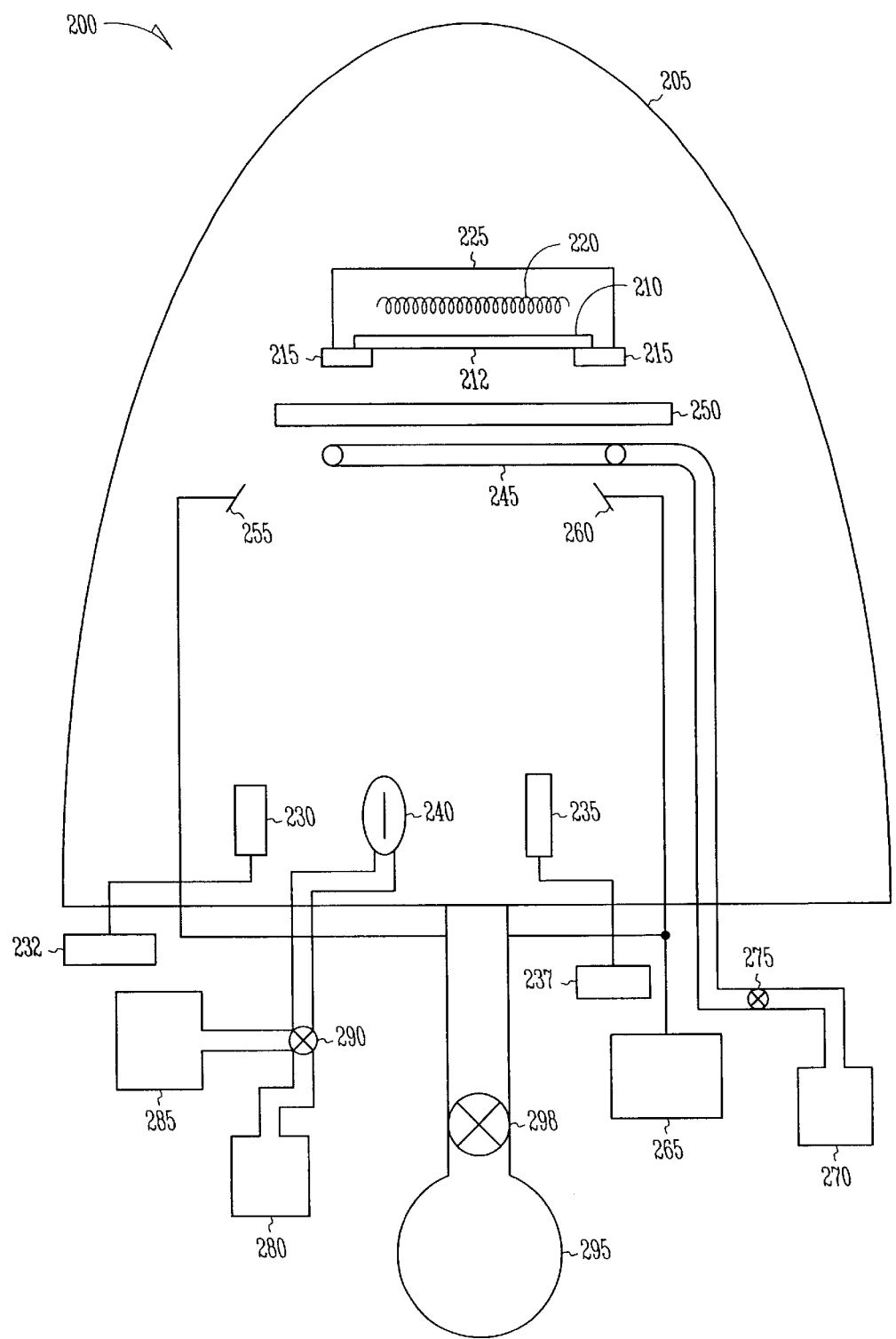
FIG. 2 illustrates an embodiment of an evaporation system for forming a dielectric film, according to the teachings of the present invention.

FIG. 2 illustrates an embodiment of an evaporation system 200 for forming a dielectric film, according to the teachings of the present invention. Evaporation system 200 includes a reaction chamber 205 in which is located a substrate 210 having a surface 212 that is to be processed. Substrate 210 rests on substrate holder 215 and its temperature can be raised above room temperature using a heater 220 with its associated reflector 225. Evaporation system 200 also includes a first electron gun device 230 regulated by electron gun controller 232 and a second electron gun device 235 regulated by electron gun controller 237 for depositing material on substrate surface 212. To assist in the deposition of material onto substrate surface 212, an ion gun 240 is provided in evaporation system 200.

Material evaporated using the electron gun devices 230, 235 and ions from ion gun 240 travel to substrate 210 through an ionizer ring 245 and shutter 250. Ionizer ring 245 provides supplemental oxygen for processes that require additional oxygen due to lost of oxygen in the evaporation of target materials. Shutter 250 is used in conjunction with the control of electron gun devices 230, 235 to control the growth rate of a film on substrate 210. The growth rate is determined using quartz crystal monitors 255, 260. The quartz crystal monitors 255, 260 are coupled to a thickness/rate control 265, typically located outside reaction chamber 205.

Also located outside reaction chamber 205 is the ozone gas source 270 including a mass-flow controller 275, and an ion gas source 280. Mass-flow controller 275 controls the flow of ozone into reaction chamber 205. Gas for the ion gun 240 is controlled by an ion gun controller 285 including a mass-flow controller 290. Further, a vacuum pump 295 with mass flow controller 298 maintains the overall atmosphere of evaporation system 200 at desired levels prior to, during, and after evaporation.

Electron gun device 230 can include an electron gun and receptacle for a target material that is to be evaporated. Target material placed in the target receptacle of electron gun device 230 is heated by impact from an electron beam from its associated electron gun. The electron beam is generated with an intensity and duration with which to evaporate the material in the target receptacle of electron gun device 230. The evaporated material then distributes throughout the reaction chamber 205. The evaporated material and pre-evaporation contaminants are prevented from depositing on substrate surface 212 in an unwanted manner by shutter 250. Electron gun device 235 is similar to electron gun device 235. In one embodiment, these devices can incorporate multiple target receptacles. Further, electron gun devices 230, 235 can be realized using commercially available devices as are known to those skilled in the art.

Ion gun 240 is a typical ion gun as is known in the art. In one embodiment, ion gun 240 provides an ion beam with an incident angle that is within +40° to −40° relative to the substrate surface 212. Ion gun 240 is a filament-type ion gun with a relatively large diameter ranging from 7.6 cm to 10 cm, which uses a hot filament to ionize gas from gas source 280. Alternately, a cold catheter discharge gun can be used. Commercial ion guns are available as is known to those skilled in the art. Ion gun 240 directed by ion gun controller 285 provides ions that are directed at the substrate surface 212. The impact of the ions provides activation energy for the formation of a dielectric film as evaporated material interacts with substrate surface 212. In addition, to passing through an opened shutter 250, the ions also pass through ionizer ring 245 as they travel to substrate surface 212.

Ionizer ring 245 provides oxygen necessary to compensate for loss of oxygen in the evaporated target material. In one embodiment, it includes a ring with a center axis. The ring has a plurality of openings adapted to direct ozone flowing to ionizer ring 245 from ozone gas source 270 towards substrate surface 212. Ozone is uniformly distributed to substrate surface 212 by ionizer ring 245 positioned generally parallel to substrate 210. Further, ionizer ring 245 has a size that does not inhibit the ion beam directed at substrate surface 212.

An evaporation system is described in co-pending, commonly assigned U.S. patent application: entitled "Formation of Metal Oxide Gate Dielectric," Ser. No. 09/779,959, filed Feb. 9, 2001, which is incorporated herein by reference. The use, construction and fundamental operation of reaction chambers for deposition of films are understood by those of ordinary skill in the art of semiconductor fabrication. The embodiments of the present invention can be practiced on a variety of such reaction chambers without undue experimentation. Furthermore, one of ordinary skill in the art will comprehend the necessary detection, measurement, and control techniques in the art of semiconductor fabrication upon reading the disclosure.

These elements of evaporation system 200 can be controlled by a computer. To focus on the use of evaporation system 200 in the various embodiments of the present invention, the computer is not shown. Those skilled in the art can appreciate that the individual elements such as pressure control, temperature control, deposition rate control, electron gun operation, and ion gun operation within evaporation system 200 can be under computer control. In one embodiment, instructions stored in a computer readable medium are executed by a computer to accurately control the integrated functioning of the elements of evaporation system 200 to form a dielectric film containing $TiO_x$ doped with a lanthanide.

Figure 3:
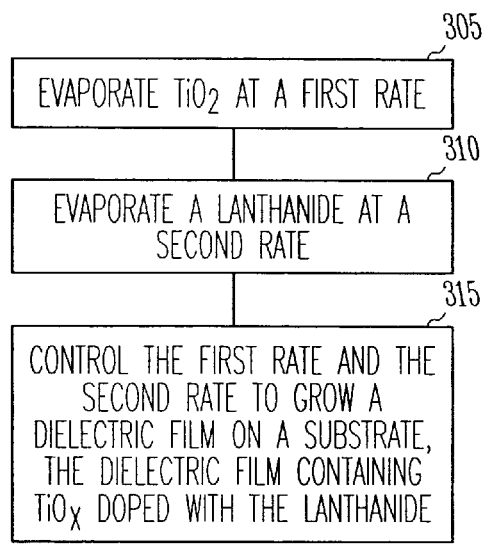
FIG. 3 illustrates a flow diagram of elements for an embodiment of a method to process a dielectric film containing $TiO_x$ doped with a lanthanide, according to the teachings of the present invention.

FIG. 3 illustrates a flow diagram of elements for an embodiment of a method to process a dielectric film containing $TiO_x$ doped with a lanthanide, according to the teachings of the present invention. In this embodiment, the method of forming a dielectric film includes evaporating $TiO_2$ at a first rate, at block 305, evaporating a lanthanide at a second rate, at block 310, and controlling the first rate and the second rate to grow a dielectric film on a substrate, where the dielectric film contains $TiO_x$ doped with the lanthanide, block 315. Controlling the evaporation rates allows the lanthanide to be selectively doped into the $TiO_x$ film within a predetermined range for the percentage of the lanthanide in the film.

In one embodiment, $TiO_2$ is evaporated by electron beam evaporation. Additionally, the lanthanide can also be evaporated using electron beam evaporation. Alternately, the $TiO_2$ and/or the lanthanide can be evaporated by other processes including thermal evaporation. Also, during evaporation of the $TiO_2$ and the lanthanide, the substrate surface is bombarded with ions to facilitate forming $TiO_x$ doped with the lanthanide on the substrate. Argon ions can be used in the ion bombardment, or alternately xenon ions.

The $TiO_2$ and the lanthanide can be evaporated at substantially the same time with different rates of evaporation to insure that a film formed on a substrate surface has lanthanide dispersed throughout the film. Additionally, oxygen is supplemented during the evaporation of the $TiO_2$ and the lanthanide using an ionizer ring.

In an embodiment, the first rate for evaporating $TiO_2$ and the second rate for evaporating lanthanide is controlled to provide a dielectric film containing $TiO_x$ doped with a predetermined percentage of the lanthanide. In one embodiment, the dielectric film can be doped in the range from about 10% to about 30% of lanthanide. Further, controlling the first and second rate allows the dielectric film to be formed having a dielectric constant ranging from about 50 to about 110. An embodiment of this method can be realized using evaporation system 200 of FIG. 2.

An embodiment of a formation of a lanthanide doped $TiO_x$ dielectric film includes forming such a film as a gate dielectric of a transistor. Evaporation system 200 is prepared by locating a substrate 210 on substrate holder 215. Substrate 210 is a material used for forming a transistor such as a silicon or silicon containing material. In other embodiments, germanium, gallium arsenide, silicon-on-sapphire substrates, or other suitable substrates may be used. This preparation process includes cleaning of the substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 205 to undergo an ion assisted electron beam evaporation process.

Evaporation system 200 is also prepared by loading a $TiO_2$ target into electron gun device 230 and loading a lanthanide target into electron gun device 235. The lanthanide is used to provide a doping for a $TiO_x$ film to be grown on substrate surface 212. The lanthanide can be selected from a group consisting of Nd, Tb, Dy. In one embodiment, the $TiO_2$ target can include $TiO_2$ slugs, where the $TiO_2$ slugs are at least 99.9999% pure. The lanthanide target can include a lanthanide that is at least 99.999% pure. Typically, the lanthanide dopant target material can be in the form of a powder. In other embodiments, other materials of varying degrees of purity can be used as a dopant in an amorphous $TiO_x$ film. Additionally, a $TiO_2$ target of less purity can also be used in an embodiment.

Reaction chamber 205 is evacuated to a low pressure to maintain the substrate surface clean and in condition for processing. In one embodiment, reaction chamber is brought to and maintained at a pressure of about $2 \times 10^{-7}$ Torr prior to evaporating the $TiO_2$ target and evaporating the lanthanide target. While, in one embodiment, during the evaporation process, reaction chamber 205 is maintained at a pressure of about $2 \times 10^{-6}$ Torr during deposition. The pressure in reaction chamber 205 is controlled by vacuum pump 295 through mass-flow controller 298.

The environment of reaction chamber 205 is further prepared by raising the temperature of substrate 210 using heater 220 and its associated reflector 225. In one embodiment, the substrate temperature is raised to and maintained at a temperature ranging from about 100° C. to about 200° C. prior to and during the formation of the $TiO_x$ dielectric layer.

Once the desired environmental conditions fo reaction chamber 205 have been attained, the evaporation process can begin. Electron gun device 230, regulated by electron gun controller 232, evaporates $TiO_2$ into reaction chamber 205 where it is distributed throughout. During the $TiO_2$ evaporation, the selected lanthanide is evaporated using electron gun device 235 regulated by electron gun controller 237, co-mingling the evaporated lanthanide with the evaporated $TiO_2$. The evaporated material is deposited on substrate surface 212. The rates for growing $TiO_x$ with lanthanide dopants is regulated using thickness/rate control 265 that receives growth information from quartz crystal monitors 255, 260.

Alternately, the $TiO_2$ evaporation and the lanthanide can be performed with one electron gun device having multiple target receptacles that can be shielded from each other. The electron gun device can further include either two electron guns individually controlled or one electron gun whose electron beam can be multiply controlled providing two beams directed individually in two directions. In such cases, the electron gun device acts as two electron guns, where one generated beam defines a first electron gun and a second generated beam defines a second electron gun.

During the $TiO_2$ evaporation, oxygen can be lost. Oxygen is supplemented at the substrate surface 212 by ionizer ring 245. Ozone is supplied from ozone gas source 270 with flow controlled by mass-flow controller 275 through the openings in ionizer ring 245. In one embodiment, the partial pressure of ozone in reaction chamber 205 is in the range of about $2 \times 10^{-5}$ torr to about $8 \times 10^{-5}$ torr. Parameters for ozone partial pressure can be determined from measuring oxygen content in the deposited film using the quartz crystal monitors 255, 260.

Evaporation of the $TiO_2$ and the lanthanide including supplementing with oxygen provides the material for forming an amorphous $TiO_x$ dielectric layer doped with the lanthanide. To assist in the formation of this dielectric layer, substrate surface is bombarded with argon ions. The ion bombardment is initiated shortly after beginning the evaporation process so that at least an initial monolayer or so of $TiO_x$ doped with the lanthanide is formed. In one embodiment, an argon beam is directed at substrate surface 212 at about one to two seconds after the evaporation process is initiated. After the initial waiting period, bombarding substrate surface 212 with ions during the $TiO_2$ evaporation includes bombarding substrate surface 212 during any part of the $TiO_2$ evaporation process. Ion gun controller 285 regulates the flow of argon gas through mass-flow controller 290 providing an argon beam density in the range of about 0.5 ma/cm$^2$ to about 1 ma/cm$^2$. In other embodiments, inert gases used in the ion beam process can include xenon and krypton at various beam densities.

Use of the electron gun controllers 232, 237 in conjunction with thickness/rate control 265 allows the $TiO_2$ to be evaporated at a first rate, and the lanthanide to be evaporated at a second rate. By controlling the first rate and the second rate, a dielectric film of $TiO_x$ doped with the lanthanide can be selectively grown with the dielectric film doped in the range from about 10% to about 30% of the lanthanide. Further, controlling the first rate and the second rate provides for growing on substrate 210 an amorphous $TiO_x$ film doped with a lanthanide, where the dielectric film has a dielectric constant ranging from about 50 to about 110. The first and second evaporation rates can also be controlled such that the lanthanide doped $TiO_x$ dielectric film can be grown at a rate ranging from about 0.2 nm/sec to about 0.5 nm/sec. Alternately, the first rate can be controlled such that the $TiO_2$ is evaporated at a rate in a range from about 0.2 nm/sec to about 0.5 nm/sec. Further, the second rate can be controlled such that the lanthanide is evaporated at a rate ranging from about 0.2 nm/sec to about 0.5 nm/sec.

In another embodiment, a method for forming a lanthanide doped $TiO_x$ dielectric film includes evaporating $TiO_2$ at a first rate using a first electron gun, evaporating a lanthanide at a second rate using a second electron gun, controlling the first rate and the second rate to grow a dielectric film on a substrate, and bombarding a surface of the substrate with ions during evaporation of the $TiO_2$ and the lanthanide, where the dielectric film contains $TiO_x$ doped with the lanthanide. The lanthanide can be selected from a group consisting of Nd, Tb, Dy. Controlling the evaporation rates allows the lanthanide to be selectively doped into the $TiO_x$ film within a predetermined range for the percentage of the lanthanide in the film. After an initial waiting period, bombarding substrate surface 212 with ions during the $TiO_2$ evaporation and/or the lanthanide evaporation includes bombarding substrate surface 212 during any part of the $TiO_2$ and the lanthanide evaporation process. The various operating parameters of the embodiments discussed above can be realized in further embodiments that do not use an ionizer ring to supplement the substrate surface with oxygen.

In another embodiment, a method for forming a lanthanide doped $TiO_x$ dielectric film includes evaporating $TiO_2$ at a first rate using a first electron gun, evaporating a lanthanide at a second rate using a second electron gun, controlling the first rate and the second rate to grow a dielectric film on a substrate, and supplementing with oxygen using an ionizer ring, where the dielectric film contains $TiO_x$ doped with the lanthanide. The lanthanide can be selected from a group consisting of Nd, Th, Dy. Controlling the evaporation rates allows the lanthanide to be selectively doped into the $TiO_x$ film within a predetermined range for the percentage of the lanthanide in the film. The various operating parameters of the embodiments discussed above can be realized in further embodiments that do not use ion assistance in the formation of the dielectric film by evaporation of $TiO_2$ and the lanthanide.

The lanthanide doped $TiO_x$ dielectric layer grown according to these various embodiments will provide smoother surfaces than expected from other current methods, which translates to higher breakdown electric fields and lower leakage currents.

Figure 4:
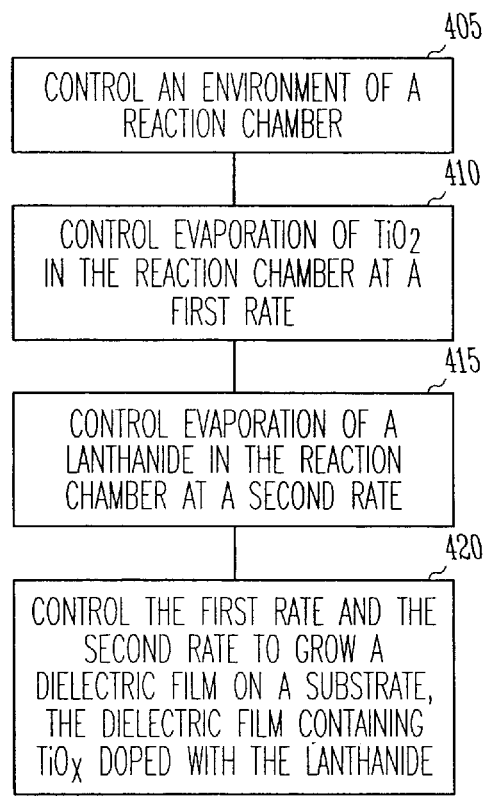
FIG. 4 illustrates a flow diagram of elements for an embodiment of a computerized method to process a dielectric film containing $TiO_x$ doped with a lanthanide, according to the teachings of the present invention.

FIG. 4 illustrates a flow diagram of elements for an embodiment of a computerized method to process a dielectric film containing $TiO_x$ doped with a lanthanide, according to the teachings of the present invention. In this embodiment, a computerized method of forming a dielectric film includes controlling the environment of a reaction chamber, at block 405, controlling the evaporation of $TiO_2$ in the reaction chamber at a first rate, at block 410, controlling the evaporation of a lanthanide in the reaction chamber at a second rate, at block 415, and controlling the first rate and the second rate to grow a dielectric film on a substrate, at block 420, where the dielectric film contains $TiO_x$ doped with the lanthanide. Controlling the evaporation rates allows the lanthanide to be selectively doped into the $TiO_x$ film within a predetermined range for the percentage of the lanthanide in the film. An embodiment of this method can be realized using evaporation system 200 of FIG. 2, where the controls for the individual elements of evaporation system 200 are coupled to a computer, not shown in FIG. 200.

The computer provides control of the $TiO_2$ evaporation by regulating the operation of electron gun device 230 by controlling electron gun control 232. Likewise, the computer provides control of the lanthanide evaporation by regulating the operation of electron gun device 235 by controlling electron gun control 237. Further, the computer also can control ion gun controller 285 and mass-flow controller 290 to regulate the ion beam generated by ion gun 240. In addition, the computer can regulate supplementing oxygen at substrate surface 212 by regulating the amount of ozone directed to ionizer 245 by controlling the mass-flow controller 275.

The computer can also control the environment of reactor chamber 205 in which a dielectric film is being formed on substrate 210. The computer regulates the pressure in reaction chamber 205 within a predetermined pressure range by controlling vacuum pump 295 and mass-flow controller 298. The computer also regulates the temperature range for substrate 210 within a predetermined range by controlling heater 220. Further, the computer controls unwanted material from reaching the substrate surface 212 by controlling shutter 250.

Receiving information from thickness/rate control 265, and controlling electron gun devices 230, 235, ion gun 240, and ionizer 245, the computer controls a first rate for $TiO_2$ evaporation and a second rate for lanthanide evaporation to selectively grow the dielectric film doped in the range from about 10% to about 30% of the lanthanide. Further, the computer can control the first rate and the second rate to grow an amorphous $TiO_x$ film doped with a lanthanide, where the $TiO_x$ film has a dielectric constant ranging from about 50 to about 110. The computer can also control the elements of evaporation system 200 to achieve the operating parameters as previously discussed in the embodiments for forming a dielectric film containing lanthanide doped $TiO_x$.

For convenience, the individual control lines to elements of evaporation system 200, as well as a computer, are not shown in FIG. 2. The above description of the computer control in conjunction with FIG. 2 provides information for those skilled in the art to practice embodiments for forming a dielectric layer containing lanthanide doped $TiO_x$ using a computerized method as described herein.

A computer for controlling the elements of evaporation system 200 of FIG. 2 operates under computer-executable instructions to perform a method for forming a dielectric film that can include controlling the environment of a reaction chamber, controlling the evaporation of $TiO_2$ in the reaction chamber at a first rate, controlling the evaporation of a lanthanide in the reaction chamber at a second rate, and controlling the first rate and the second rate to grow a dielectric film on a substrate, where the dielectric film contains $TiO_x$ doped with the lanthanide. Controlling the evaporation rates allows the lanthanide to be selectively doped into the $TiO_x$ film within a predetermined range for the percentage of the lanthanide in the film. Using a computer to control parameters for growing the dielectric film provides for processing the dielectric film over a wide range of parameters allowing for the determination of an optimum parameter set for the evaporation system used. The computer-executable instructions can be provided in any computer-readable medium. Such computer-readable medium includes, but is not limited to, floppy disks, diskettes, hard disks, CD-ROMS, flash ROMS, nonvolatile ROM, and RAM.

The embodiments described herein provide a means for growing a dielectric film having a wide range of useful equivalent oxide thickness, $t_{eq}$, associated with a dielectric constant in the range from about 50 to about 110. The $t_{eq}$ range in accordance with embodiments of the present invention are shown in the following

| κ | Physical Thickness t = 1.0 nm (1.0 × 10¹ Å) $t_{eq}$ (Å) | Physical Thickness t = 5.0 nm (5.0 × 10¹ Å) $t_{eq}$ (Å) | Physical Thickness t = 100.0 nm (1 × 10³ Å) $t_{eq}$ (Å) | Physical Thickness t = 350 nm (3.5 × 10³ Å) $t_{eq}$ (Å) |
|---|---|---|---|---|
| 50 | 0.78 | 3.90 | 78.00 | 273.00 |
| 75 | 0.52 | 2.60 | 52.00 | 182.00 |
| 100 | 0.39 | 1.95 | 39.00 | 136.50 |
| 110 | 0.35 | 1.77 | 35.45 | 124.09 |

The relatively large dielectric constant for material layers of lanthanide doped $TiO_x$ allows for the engineering of dielectric films having a physical thickness in the 100 nm (1000 Å) range, while achieving a $t_{eq}$ of less than 100 Å. Further, growing ultra-thin layers, or films, of lanthanide doped $TiO_x$ provides for $t_{eq}$ in the range of several monolayers. From above, it is apparent that a film containing lanthanide doped $TiO_x$ can be attained with a $t_{eq}$ ranging from 1.5 Å to 5 Å. Further, such a film can provide a $t_{eq}$ significantly less than 2 or 3 Å, even less than 1.5 Å.

Further, dielectric films of lanthanide doped $TiO_x$ formed by ion assisted electron beam evaporation can provide not only ultra thin $t_{eq}$ films, but also films with relatively low leakage current. In addition to using ion assisted electron beam evaporation, attainment of relatively low leakage current is engineered by doping with lanthanides selected from a group consisting of Nd, Th, and Dy. Though a layer of undoped $TiO_x$ is typically amorphous, which assists the reduction of leakage current, evaporating these lanthanides during the evaporation of $TiO_2$ provides for a doped amorphous $TiO_x$ layer with enhanced leakage current characteristics. Leakage currents on the order of $10^{-7}$ A/cm$^2$ or smaller in $TiO_x$ layers doped with Nd, Tb, or Dy can be attained, which are orders of magnitude smaller than for undoped $TiO_x$. Further, the breakdown electric fields are several factors larger for layers of $TiO_x$ doped with Nd, Tb, or Dy than for layers of undoped $TiO_x$.

The doping of the $TiO_x$ layer with a lanthanide occurs as a substitution of a lanthanide atom for a Ti atom. The resultant doped $TiO_x$ layer is a layer of amorphous $Ti_{1-y}L_yO_x$, where L is a lanthanide. Controlling the evaporation of $TiO_2$ and the evaporation of the selected lanthanide allows a $Ti_{1-y}L_yO_x$, or lanthanide doped $TiO_x$, layer to be formed where the lanthanide, L, can range from about 10% to about 30% of the dielectric layer formed. Such $TiO_x$ layers doped with Nd, Tb, or Dy formed by ion bean assisted electron beam evaporation can provide the reduced leakage current and increased breakdown electric fields mentioned above.

A transistor 100 as depicted in FIG. 1 can be formed by forming a source region 120 and a drain region 130 in a silicon based substrate 110 where the source region 120 and the drain region 130 are separated by a body region 132. The body region 132 separated by the source 120 and the drain 130 defines a channel having a channel length 134. $TiO_2$ is evaporated using an electron gun at a controlled rate. A lanthanide selected from a group consisting of Nd, Tb, and Dy is evaporated using a second electron gun at a second controlled rate. Evaporating the lanthanide source is begun substantially concurrent with evaporating $TiO_2$, while bombarding the body region with Ar ions shortly after the evaporation of the $TiO_2$ has begun, forming a gate dielectric 140 containing lanthanide doped $TiO_x$ on the body region. A gate is formed over the gate dielectric 140. Typically, forming the gate includes forming a polysilicon layer, though a metal gate can be formed in an alternative process. Forming the substrate, source region, drain region, and the gate is performed using standard processes known to those skilled in the art. Additionally, the sequencing of the various elements of the process for forming a transistor is conducted with standard fabrication processes, also as known to those skilled in the art.

Figure 5:
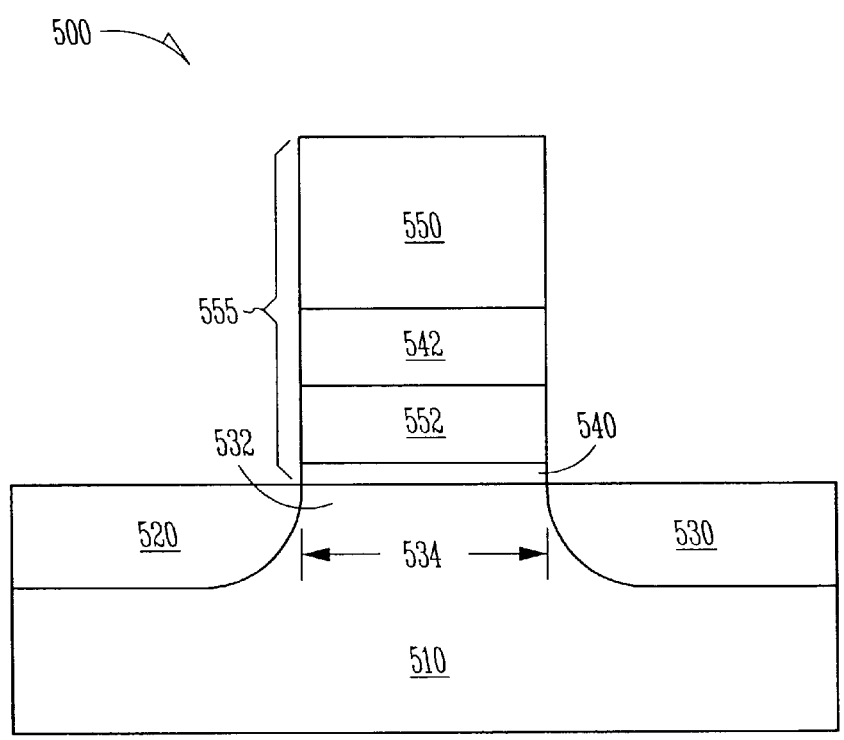
FIG. 5 shows an embodiment of a configuration of a transistor capable of being fabricated according to the teachings of the present invention.

The method for forming a lanthanide doped $TiO_x$ in various embodiments can be applied to other transistor structures having dielectric layers. FIG. 5 shows an embodiment of a configuration of a transistor 500 capable of being fabricated, according to the teachings of the present invention. In the embodiment of FIG. 5, transistor 500 includes a silicon based substrate 510 with a source 520 and a drain 530 separated by a body region 532. The body region 532 between the source 520 and the drain 530 defines a channel region having a channel length 534. Located above the body region 532 is a stack 555 including a gate dielectric 540, a floating gate 552, a floating gate dielectric 542, and control gate 550. The gate dielectric 540 can be formed as described above with the remaining elements of the transistor 500 formed using processes known to those skilled in the art. Alternately, both the gate dielectric 540 and the floating gate dielectric 542 can be formed as dielectric layers containing lanthanide doped $TiO_x$ in various embodiments as described herein.

The embodiments of methods for forming lanthanide doped TiOX dielectric films can also be applied to forming capacitors in various integrated circuits, memory devices, and electronic systems. In one embodiment for forming a capacitor, a method includes forming a first conductive layer, evaporating $TiO_2$ at a first rate, evaporating a lanthanide at a second rate, controlling the first rate and the second rate to grow a dielectric film on the first conductive layer, where the dielectric film contains $TiO_x$ doped with the lanthanide, and forming a second conductive layer on the dielectric film. Controlling the evaporation rates allows the lanthanide to be selectively doped into the $TiO_x$ film within a predetermined range for the percentage of the lanthanide in the film. Alternately, a capacitor can be formed by forming a conductive layer on a substrate, forming a dielectric film containing lanthanide doped $TiO_x$ using any of the embodiments described herein, and forming another conductive layer on the dielectric film.

Figure 6:
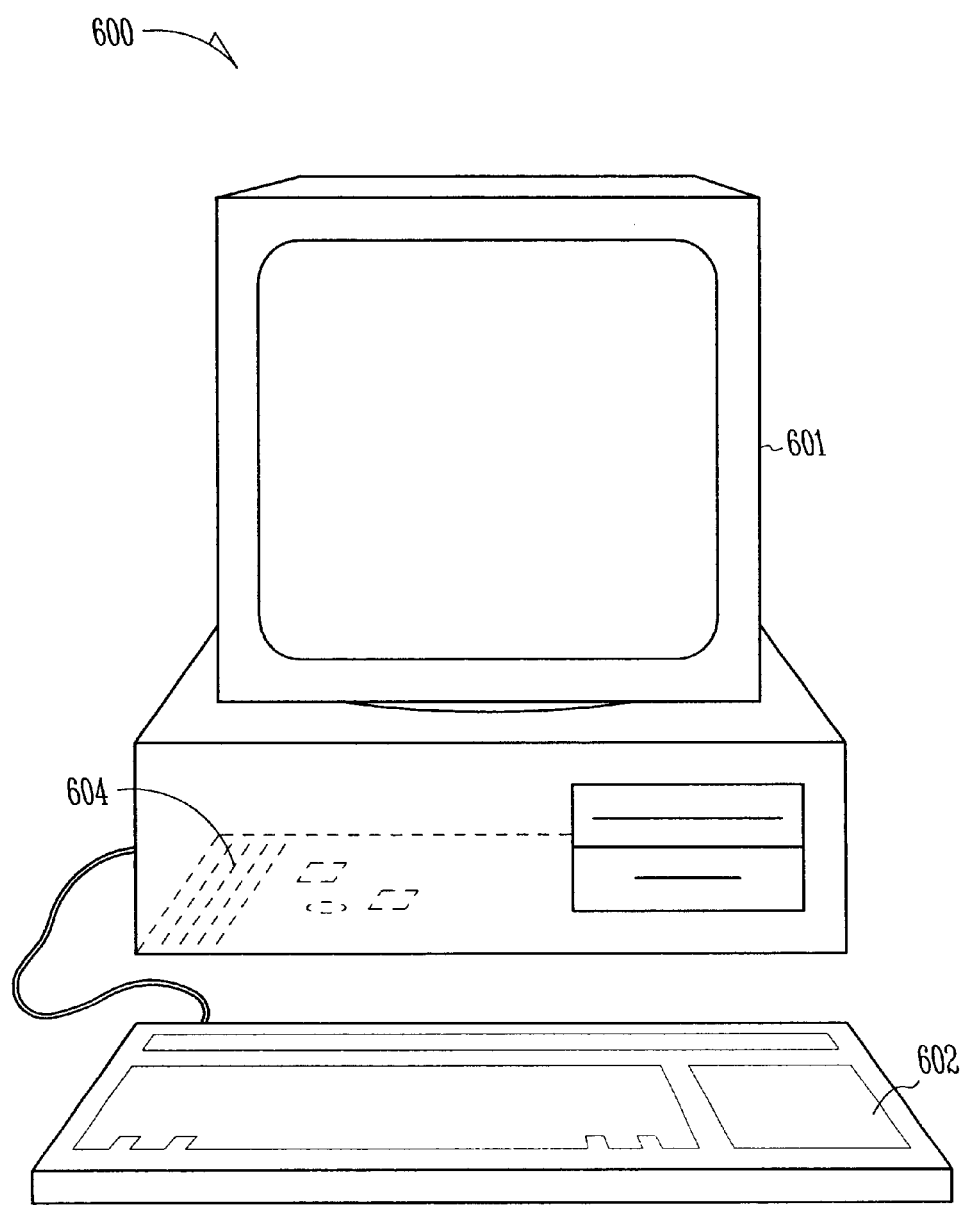
FIG. 6 shows an embodiment of a personal computer incorporating devices according to the teachings of the present invention.
Figure 7:
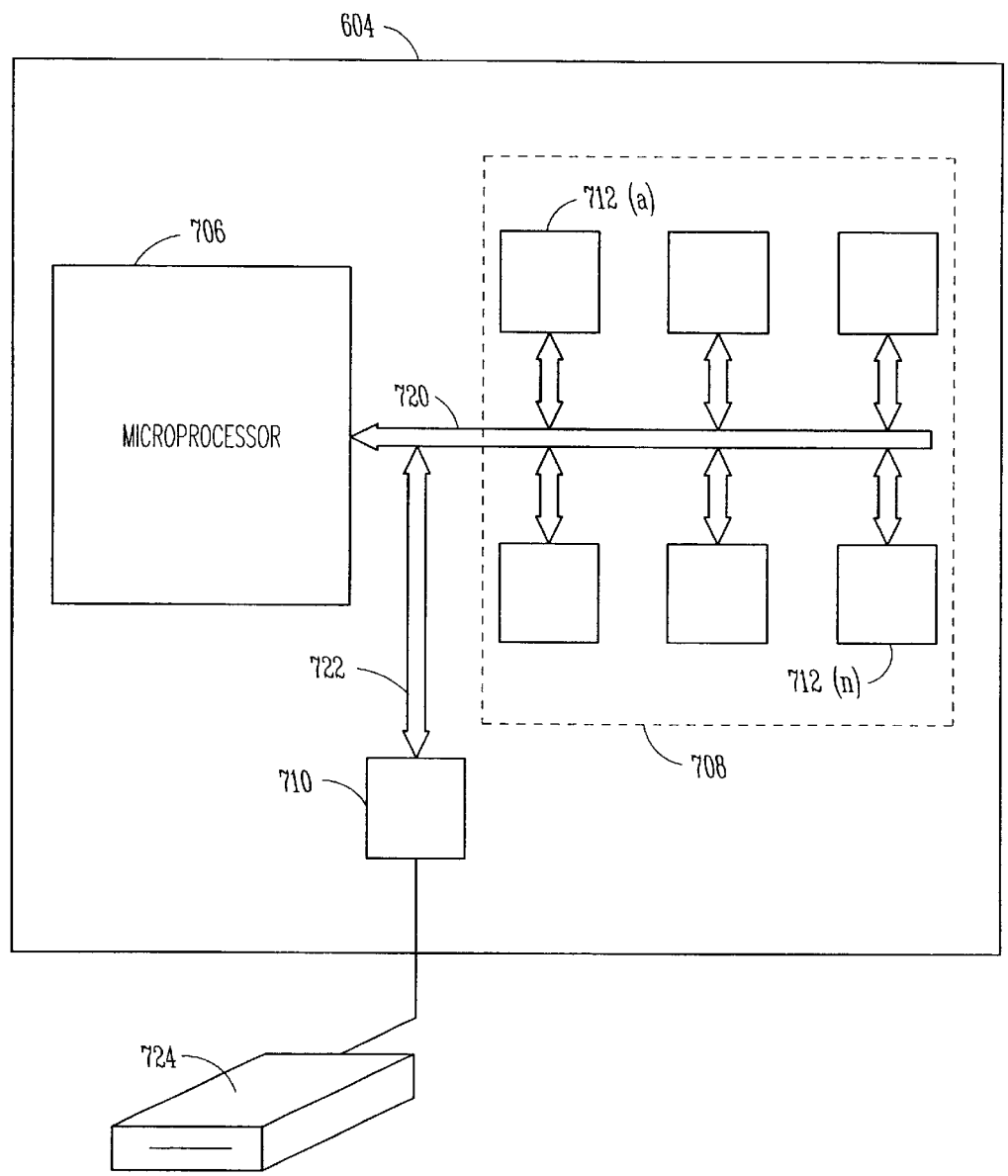
FIG. 7 illustrates a schematic view of an embodiment of a central processing unit incorporating devices according to the teachings of the present invention.
Figure 8:
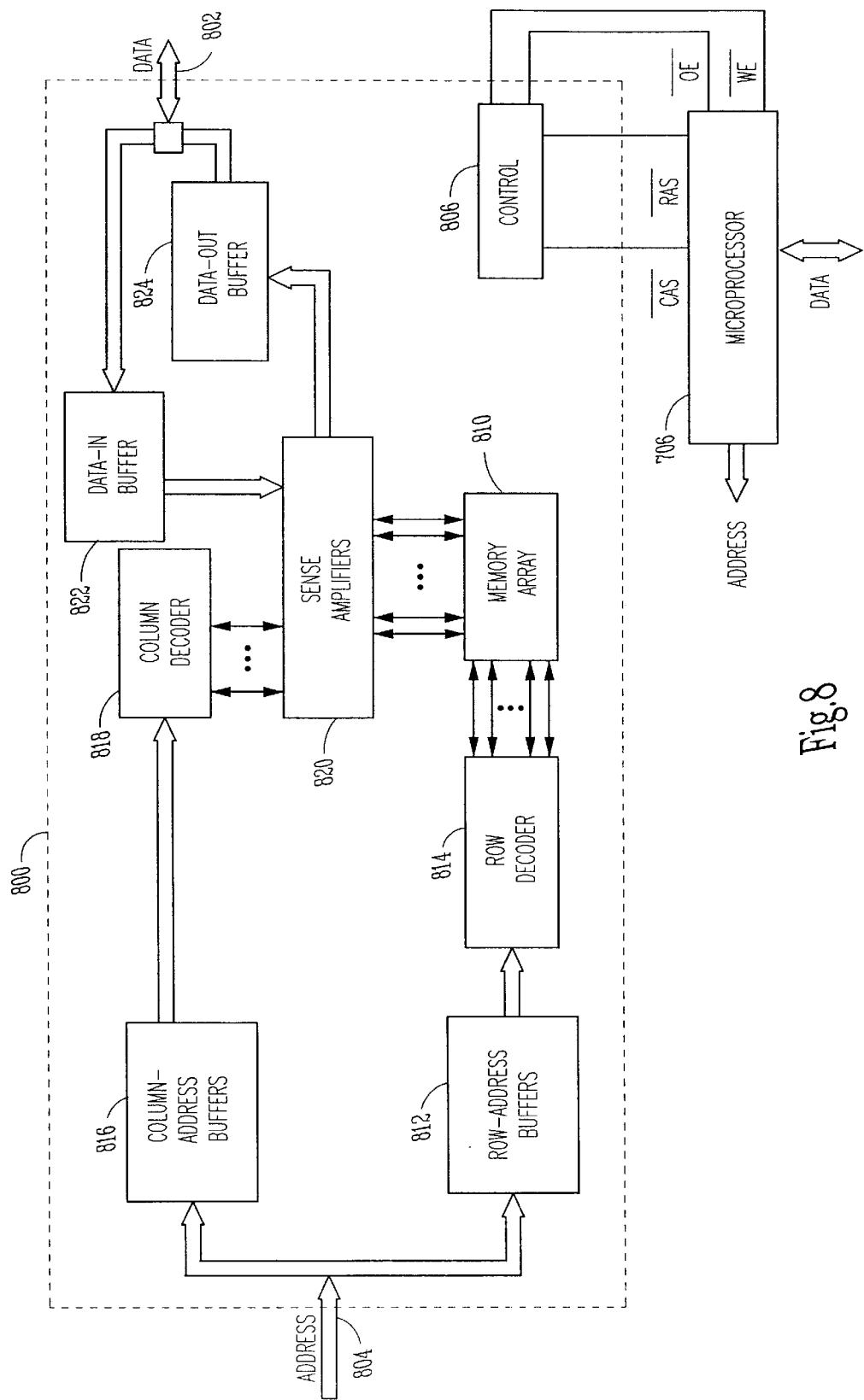
FIG. 8 illustrates a schematic view of an embodiment of a DRAM memory device, according to the teachings of the present invention.

Transistors, capacitors, and other devices having dielectric films created by the methods described above may be implemented into memory devices and electronic systems including information handling devices. Information handling devices having a dielectric layer containing lanthanide doped $TiO_x$ can be constructed using various embodiments of the methods described above. Such information devices can include wireless systems, telecommunication systems, and computers. An embodiment of a computer having a dielectric layer containing lanthanide doped $TiO_x$ is shown in FIGS. 6–8 and described below. While specific types of memory devices and computing devices are shown below, it will be recognized by one skilled in the art that several types of memory devices and electronic systems including information handling devices utilize the invention.

A personal computer, as shown in FIGS. 6 and 7, can include a monitor 600, keyboard input 602 and a central processing unit 604. The processor unit typically includes microprocessor 706, memory bus circuit 708 having a plurality of memory slots 712 (a–n), and other peripheral circuitry 710. Peripheral circuitry 710 permits various peripheral devices 724 to interface processor-memory bus 720 over input/output (I/O) bus 722. The personal computer shown in FIGS. 6 and 7 also includes at least one transistor having a gate dielectric according an embodiment of the present invention.

Microprocessor 706 produces control and address signals to control the exchange of data between memory bus circuit 708 and microprocessor 706 and between memory bus circuit 708 and peripheral circuitry 710. This exchange of data is accomplished over high speed memory bus 720 and over high speed I/O bus 722.

Coupled to memory bus 720 are a plurality of memory slots 712 (a–n) which receive memory devices well known to those skilled in the art. For example, single in-line memory modules (SIMMs) and dual in-line memory modules (DIMMs) may be used in the implementation of embodiment of the present invention.

These memory devices can be produced in a variety of designs which provide different methods of reading from and writing to the dynamic memory cells of memory slots 712. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 708.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 720. Other alternative types of devices include SDRAM, DDR SDRAM, SLDRAM and Direct RDRAM as well as others such as SRAM or Flash memories.

FIG. 8 illustrates a schematic view of an embodiment of a DRAM memory device 800, according to the teachings of the present invention. Illustrative DRAM memory device 800 is compatible with memory slots 712 (a–n). The description of DRAM memory device 800 has been simplified for purposes of illustrating a DRAM memory device and is not intended to be a complete description of all the features of a DRAM. Those skilled in the art will recognize that a wide variety of memory devices may be used in the implementation of embodiments of the present invention. The embodiment of a DRAM memory device shown in FIG. 8 includes at least one transistor having a gate dielectric containing lanthanide doped $TiO_x$ according to the teachings of the present invention.

Control, address and data information provided over memory bus 720 is further represented by individual inputs to DRAM 800, as shown in FIG. 8. These individual representations are illustrated by data lines 802, address lines 804 and various discrete lines directed to control logic 806.

As is well known in the art, DRAM 800 includes memory array 810 which in turn comprises rows and columns of addressable memory cells. Each memory cell in a row is coupled to a common word line. The word line is coupled to gates of individual transistors, where at least one transistor has a gate coupled to a gate dielectric containing lanthanide doped $TiO_x$ in accordance with the method and structure previously described above. Additionally, each memory cell in a column is coupled to a common bit line. Each cell in memory array 810 includes a storage capacitor and an access transistor as is conventional in the art.

DRAM 800 interfaces with, for example, microprocessor 706 through address lines 804 and data lines 802. Alternatively, DRAM 800 may interface with a DRAM controller, a micro-controller, a chip set or other electronic system. Microprocessor 706 also provides a number of control signals to DRAM 800, including but not limited to, row and column address strobe signals RAS and CAS, write enable signal WE, an output enable signal OE and other conventional control signals.

Row address buffer 812 and row decoder 814 receive and decode row addresses from row address signals provided on address lines 804 by microprocessor 706. Each unique row address corresponds to a row of cells in memory array 810. Row decoder 814 includes a word line driver, an address decoder tree, and circuitry which translates a given row address received from row address buffers 812 and selectively activates the appropriate word line of memory array 810 via the word line drivers.

Column address buffer 816 and column decoder 818 receive and decode column address signals provided on address lines 804. Column decoder 818 also determines when a column is defective and the address of a replacement column. Column decoder 818 is coupled to sense amplifiers 820. Sense amplifiers 820 are coupled to complementary pairs of bit lines of memory array 810.

Sense amplifiers 820 are coupled to data-in buffer 822 and data-out buffer 824. Data-in buffers 822 and data-out buffers 824 are coupled to data lines 802. During a write operation, data lines 802 provide data to data-in buffer 822. Sense amplifier 820 receives data from data-in buffer 822 and stores the data in memory array 810 as a charge on a capacitor of a cell at an address specified on address lines 804.

During a read operation, DRAM 800 transfers data to microprocessor 706 from memory array 810. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 820 detects and amplifies a difference in voltage between the complementary bit lines. The sense amplifier passes the amplified voltage to data-out buffer 824.

Control logic 806 is used to control the many available functions of DRAM 800. In addition, various control circuits and signals not detailed herein initiate and synchronize DRAM 800 operation as known to those skilled in the art. As stated above, the description of DRAM 800 has been simplified for purposes of illustrating an embodiment of the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present invention. The DRAM implementation described herein is illustrative only and not intended to be exclusive or limiting.

Conclusion

A gate dielectric containing a lanthanide doped $TiO_x$ film and a method of fabricating such a film produces a reliable gate dielectric having an equivalent oxide thickness thinner than attainable using $SiO_2$. Gate dielectrics containing a lanthanide doped $TiO_x$ film formed using the methods described herein are thermodynamically stable such that the gate dielectrics formed will have minimal reactions with a silicon substrate or other structures during processing.

Lanthanide doped $TiO_x$ films formed by ion assisted electron beam evaporation can be amorphous and possess smooth surfaces and high packing densities, which limits the occurrence of adsorbed water in the films. Such lanthanide doped $TiO_x$ films can provide enhanced electrical properties due to their smoother surface resulting in reduced leakage current. Furthermore, doping with a lanthanide such as Nd, Tb, and Dy provide for increased breakdown electric fields and decreased leakage currents than can be attained with an undoped $TiO_x$ film.

Transistors, higher level ICs or devices, and systems are constructed utilizing the novel process for forming a gate dielectric having an ultra thin equivalent oxide thickness, $t_{eq}$. Gate dielectric layers containing a lanthanide doped film are formed having a high dielectric constant (κ), where the gate dielectrics are capable of a $t_{eq}$ thinner than 10 Å, thinner than the expected limit for $SiO_2$ gate dielectrics. At the same time, the physical thickness of the lanthanide doped $TiO_x$ film is much larger than the $SiO_2$ thickness associated with the $t_{eq}$ limit of $SiO_2$. Forming the larger thickness provides advantages in processing the gate dielectric. The control of evaporation rates, ion beam properties, and oxygen content provides a wide range for selecting process control. Further, a lanthanide doped $TiO_x$ film processed in relatively low temperatures can provide amorphous dielectric films having relatively low leakage current for use as dielectric layers in electronic devices and systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a dielectric film, comprising:
   evaporating $TiO_2$ at a first rate;
   evaporating a lanthanide at a second rate; and
   controlling the first rate and the second rate to grow a dielectric film on a substrate, the dielectric film containing $TiO_x$ doped with the lanthanide.

2. The method of claim 1, wherein evaporating a lanthanide includes evaporating a lanthanide selected from a group consisting of Nd, Tb, Dy.

3. The method of claim 1, wherein evaporating $TiO_2$ includes evaporating $TiO_2$ by electron beam evaporation.

4. The method of claim 1, wherein evaporating a lanthanide includes evaporating the lanthanide by electron beam evaporation.

5. The method of claim 1, wherein controlling the first rate and the second rate includes controlling the first rate and the second rate to selectively grow the dielectric film doped in the range from about 10% to about 30% lanthanide.

6. The method of claim 1, wherein the method further includes bombarding a surface of the substrate with ions during the $TiO_2$ evaporation.

7. The method of claim 6, wherein bombarding the surface with ions includes using an Ar ion gun.

8. The method of claim 1, wherein the method further includes supplementing with oxygen using an ionizer ring.

9. The method of claim 1, wherein controlling the first rate and the second rate to grow a dielectric film includes controlling the first rate and the second rate to grow an amorphous $TiO_x$ film doped with a lanthanide, the dielectric film having a dielectric constant ranging from about 50 to about 110.

10. A method of forming a dielectric film, comprising:
    evaporating $TiO_2$ at a first rate using a first electron gun;
    evaporating a lanthanide at a second rate using a second electron gun; and
    controlling the first rate and the second rate to grow a dielectric film on a substrate, the dielectric film containing $TiO_x$ doped with the lanthanide.

11. The method of claim 10, wherein evaporating a lanthanide includes evaporating a lanthanide selected from a group consisting of Nd, Tb, Dy.

12. The method of claim 10, wherein evaporating $TiO_2$ includes evaporating $TiO_2$ slugs, the $TiO_2$ slugs being at least 99.9999% pure.

13. The method of claim 10, wherein evaporating a lanthanide includes evaporating a lanthanide that is at least 99.999% pure.

14. The method of claim 10, wherein controlling the first rate and the second rate includes controlling the first rate and the second rate to selectively grow the dielectric film doped in the range from about 10% to about 30% lanthanide.

15. The method of claim 10, wherein the method further includes maintaining a pressure of about $2\times10^{-7}$ Torr prior to evaporating the $TiO_2$ and evaporating the lanthanide, and maintaining a pressure of about $2\times10^{-6}$ Torr during the $TiO_2$ and the lanthanide evaporation.

16. The method of claim 10, wherein the method further includes maintaining the substrate at a temperature ranging from about 100° C. to about 200° C.

17. The method of claim 10, wherein controlling the first rate includes controlling the first rate such that the $TiO_2$ evaporates a rate in a range from about 0.2 nm/sec to about 0.5 nm/sec.

18. The method of claim 10, wherein controlling the second rate includes controlling the second rate such that the lanthanide evaporates at a rate in a range from about 0.2 nm/sec to about 0.5 nm/sec.

19. The method of claim 10, wherein controlling the first rate and the second rate to grow a dielectric film includes controlling the first rate and the second rate to grow an amorphous $TiO_x$ film doped with a lanthanide, the dielectric film having a dielectric constant ranging from about 50 to about 110.

20. A method of forming a dielectric film, comprising:
    evaporating $TiO_2$ at a first rate using a first electron gun;
    evaporating a lanthanide at a second rate using a second electron gun;
    controlling the first rate and the second rate to grow a dielectric film on a substrate; and
    bombarding a surface of the substrate with ions during evaporation of the $TiO_2$, wherein the dielectric film contains $TiO_x$ doped with the lanthanide.

21. The method of claim 20, wherein evaporating a lanthanide includes evaporating a lanthanide selected from a group consisting of Nd, Tb, Dy.

22. The method of claim 20, wherein controlling the first rate and the second rate includes controlling the first rate and the second rate to selectively grow the dielectric film doped in the range from about 10% to about 30% lanthanide.

23. The method of claim 20, wherein bombarding the surface with ions includes using an Ar ion gun.

24. The method of claim 20, wherein controlling the first rate and the second rate to grow a dielectric film includes growing an amorphous $TiO_x$ film doped with a lanthanide, the dielectric film having a dielectric constant ranging from about 50 to about 110.

25. A method of forming a dielectric film, comprising:
    evaporating $TiO_2$ at a first rate using a first electron gun;
    evaporating a lanthanide at a second rate using a second electron gun;
    controlling the first rate and the second rate to grow a dielectric film on a substrate; and
    supplementing with oxygen using an ionizer ring, wherein the dielectric film contains $TiO_x$ doped with the lanthanide.

26. The method of claim 25, wherein evaporating a lanthanide includes evaporating a lanthanide selected from a group consisting of Nd, Tb, Dy.

27. The method of claim 25, wherein the method further includes maintaining a pressure of about $2\times10^{-7}$ Torr prior to evaporating the $TiO_2$ and evaporating the lanthanide, and maintaining a pressure of about $2\times10^{-6}$ Torr during the $TiO_2$ and the lanthanide evaporation.

28. The method of claim 25, wherein controlling the first rate and the second rate to grow a dielectric film includes controlling the first rate and the second rate to grow an amorphous TiO$_x$ film doped with a lanthanide, the dielectric film having a dielectric constant ranging from about 50 to about 110.

29. A method of forming a transistor, comprising:
   forming a source region and a drain region;
   forming a body region between the source and drain regions;
   evaporating TiO$_2$ at a first rate;
   evaporating a lanthanide at a second rate; and
   controlling the first rate and the second rate to grow a dielectric film on the body region, the dielectric film containing TiO$_x$ doped with the lanthanide; and
   coupling a gate to the dielectric film containing TiO$_x$.

30. The method of claim 29, wherein evaporating a lanthanide includes evaporating a lanthanide selected from a group consisting of Nd, Tb, Dy.

31. The method of claim 29, wherein evaporating TiO$_2$ includes evaporating TiO$_2$ by electron beam evaporation.

32. The method of claim 29, wherein controlling the first rate and the second rate includes controlling the first rate and the second rate to selectively grow the dielectric film doped in the range from about 10% to about 30% lanthanide.

33. The method of claim 29, wherein the method further includes bombarding a surface of the substrate with ions during the TiO$_2$ evaporation.

34. The method of claim 29, wherein the method further includes supplementing with oxygen using an ionizer ring.

35. The method of claim 29, wherein controlling the first rate and the second rate to grow a dielectric film includes controlling the first rate and the second rate to grow an amorphous TiO$_x$ film doped with a lanthanide, the dielectric film having a dielectric constant ranging from about 50 to about 110.

36. A method of forming a capacitor, comprising:
   forming a first conductive layer on a substrate;
   evaporating TiO$_2$ at a first rate using a first electron gun;
   evaporating a lanthanide at a second rate using a second electron gun; and
   controlling the first rate and the second rate to grow a dielectric film on the first conductive layer, the dielectric film containing TiO$_x$ doped with the lanthanide; and
   forming a second conductive layer on the dielectric film.

37. The method of claim 36, wherein evaporating a lanthanide includes evaporating a lanthanide selected from a group consisting of Nd, Tb, and Dy.

38. The method of claim 36, wherein controlling the first rate and the second rate includes controlling the first rate and the second rate to selectively grow the dielectric film doped in the range from about 10% to about 30% lanthanide.

39. The method of claim 36, wherein the method further includes bombarding a surface of the substrate with ions during the TiO$_2$ evaporation.

40. The method of claim 36, wherein the method further includes supplementing with oxygen using an ionizer ring.

41. The method of claim 36, wherein controlling the first rate and the second rate includes controlling the first rate and the second rate to grow an amorphous lanthanide doped TiO$_x$ film, the dielectric film having a dielectric constant ranging from about 50 to about 110.

42. A method of forming a memory array, comprising:
   forming a number of access transistors, at least one access transistor including a dielectric film on a body region between a source region and a drain region, the dielectric film containing TiO$_x$ formed by a method including:
      evaporating TiO$_2$ at a first rate;
      evaporating a lanthanide at a second rate; and
      controlling the first rate and the second rate to grow the dielectric film on the body region, the dielectric film containing TiO$_x$ doped with the lanthanide; and
   forming a number of word lines coupled to a number of gates of the number of access transistors;
   forming a number of source lines coupled to a number of source regions of the number of access transistors; and
   forming a number of bit lines coupled to a number of drain regions of the number of access transistors.

43. The method of claim 42, wherein evaporating the lanthanide includes evaporating the lanthanide selected from a group consisting of Nd, Tb, Dy.

44. The method of claim 42, wherein evaporating the lanthanide includes evaporating the lanthanide by electron beam evaporation.

45. The method of claim 42, wherein controlling the first rate and the second rate includes controlling the first rate and the second rate to selectively grow the dielectric film doped in the range from about 10% to about 30% lanthanide.

46. The method of claim 42, wherein the method further includes bombarding a surface of the body region with ions during the TiO$_2$ evaporation.

47. The method of claim 42, wherein controlling the first rate and the second rate to grow a dielectric film includes controlling the first rate and the second rate to grow an amorphous TiO$_x$ film doped with a lanthanide.

48. A method of forming an electronic system, comprising:
   providing a processor;
   coupling a memory array to the processor, wherein the memory array includes at least one access transistor having a dielectric film on a body region, the dielectric film formed by a method including:
      evaporating TiO$_2$ at a first rate;
      evaporating a lanthanide at a second rate; and
      controlling the first rate and the second rate to grow the dielectric film on the body region, the dielectric film containing TiO$_x$ doped with the lanthanide; and
   providing a system bus that couples the processor to the memory array.

49. The method of claim 48, wherein evaporating a lanthanide includes evaporating a lanthanide selected from a group consisting of Nd, Tb, Dy.

50. The method of claim 48, wherein evaporating TiO$_2$ includes evaporating TiO$_2$ by electron beam evaporation.

51. The method of claim 48, wherein controlling the first rate and the second rate includes controlling the first rate and the second rate to selectively grow the dielectric film doped in the range from about 10% to about 30% lanthanide.

52. The method of claim 48, wherein the method further includes supplementing with oxygen using an ionizer ring.

53. The method of claim 48, wherein controlling the first rate and the second rate to grow a dielectric film includes controlling the first rate and the second rate to grow an amorphous TiO$_x$ film doped with a lanthanide, the dielectric film having a dielectric constant ranging from about 50 to about 110.

* * * * *

UNITED STATES PATENT AND TRADEMARK OFFICE
CERTIFICATE OF CORRECTION

PATENT NO. : 6,790,791 B2
DATED : September 14, 2004
INVENTOR(S) : Ahn al et.

It is certified that error appears in the above-identified patent and that said Letters Patent is hereby corrected as shown below:

Title page,
Item [56], References Cited, U.S. PATENT DOCUMENTS, delete "345" and insert -- 346 --, therefor; delete "2003/0028747" and insert -- 2003/022847 --, therefor.
Item [56], References Cited, OTHER PUBLICATIONS, insert -- (1997), -- before "pp". delete "(2000,)" and insert -- (2000) --, therefor; delete "Pat B" and insert -- Part B --, therefor.

Column 5,
Line 25, delete "$t_{eq}=t_{sio}^2+(k_{ox}/k)t$" and insert -- $t_{eq}=t_{sio2}+(k_{ox}/k)t$ --, therefor.

Column 9,
Line 42, delete "fo" and insert -- for --, therefor.

Column 11,
Line 7, delete "Th" and insert -- Tb --, therefor.

Column 13,
Line 3, delete "Th" and insert -- Tb --, therefor.

Column 18,
Line 13, after "evaporates" insert -- at --.

Signed and Sealed this

Fifth Day of April, 2005

JON W. DUDAS
*Director of the United States Patent and Trademark Office*